(12) United States Patent
Dayan et al.

(10) Patent No.: US 11,996,817 B2
(45) Date of Patent: May 28, 2024

(54) FINITE IMPULSE RESPONSE FILTER

(71) Applicant: Solanium Labs Ltd., Hod Hasharon (IL)

(72) Inventors: David Dayan, Hod Hasharon (IL); Raz Dagan, Hod Hasharon (IL); Or Vidal, Hod Hasharon (IL)

(73) Assignee: Solanium Labs Ltd., Hod Hasharon (IL)

( * ) Notice: Subject to any disclaimer, the term of this patent is extended or adjusted under 35 U.S.C. 154(b) by 89 days.

(21) Appl. No.: 17/804,807

(22) Filed: May 31, 2022

(65) Prior Publication Data

US 2022/0399878 A1 Dec. 15, 2022

Related U.S. Application Data

(60) Provisional application No. 63/208,976, filed on Jun. 10, 2021.

(51) Int. Cl.
*H03M 7/00* (2006.01)
*H03H 17/06* (2006.01)

(52) U.S. Cl.
CPC ............... *H03H 17/0635* (2013.01)

(58) Field of Classification Search
CPC .......... H03H 17/0635; H03H 17/06
USPC ........................................... 341/61
See application file for complete search history.

(56) References Cited

U.S. PATENT DOCUMENTS 9,898,286 B2 * 2/2018 Van Dalen .......... G06F 9/30036

* cited by examiner

*Primary Examiner* — Jean B Jeanglaude
(74) *Attorney, Agent, or Firm* — Reches Patents

(57) ABSTRACT

A system, a non-transitory computer readable media and a method for FIR filtering. The method may include obtaining a set of input samples; and concurrently applying a FIR filtering process on the set of input samples to provide a set of FIR filtered output samples. The latter may include calculating intermediate results that represent a first number of coefficient-input sample products, while calculating only some of the first number of coefficient-input sample products, wherein the calculating of the intermediate results is executed by using less than a first number of multipliers.

23 Claims, 7 Drawing Sheets

```
┌─────────────────────────────────────────────────────────────────────────┐
│ Prforming, by first multipliers, an element-wise multiplication of input│
│ samples of a first subset of the set by a first subset of coefficients  │
│ to provide first intermediate results that belong to the                │
│ preliminary results 142                                                 │
└─────────────────────────────────────────────────────────────────────────┘
                                    │
                                    ▼
┌─────────────────────────────────────────────────────────────────────────┐
│ Calculating second preliminary results that are a second number of sums │
│ of certain coefficient-input sample products, wherein the second        │
│ preliminary results are calculated without calculating each one of the  │
│ certain coefficient-input sample products 144                           │
│                                                                         │
│  ┌───────────────────────────────────────────────────────────────────┐  │
│  │ Performing, by first adders, an element-wise addition of pairs of │  │
│  │ input samples of the set, to provide input samples sums 146       │  │
│  └───────────────────────────────────────────────────────────────────┘  │
│                                                                         │
│  ┌──────────────────────────────┐                                       │
│  │ Obtaining coefficient sums 148│                                      │
│  └──────────────────────────────┘                                       │
│                                                                         │
│  ┌───────────────────────────────────────────────────────────────────┐  │
│  │ Performing, by second multiplies, an element-wise multiplication  │  │
│  │ of the input samples sums by coefficients sums to provide second  │  │
│  │ preliminary results that belong to the preliminary results 150    │  │
│  └───────────────────────────────────────────────────────────────────┘  │
│                                                                         │
│  ┌───────────────────────────────────────────────────────────────────┐  │
│  │ Extracting, by using second units that may include adders and/or  │  │
│  │ subtractors, the second intermediate results. 152                 │  │
│  └───────────────────────────────────────────────────────────────────┘  │
└─────────────────────────────────────────────────────────────────────────┘

FINITE IMPULSE RESPONSE FILTER

BACKGROUND

The finite impulse response (FIR) filter is a basic building block in modem architecture.

The FIRs are considered significant power consumers in high-speed modems—especially due to the usage of many multipliers.

Creative power efficient FIR design is a differentiator between designs.

The relationship between input samples x and FIR filtered output samples y is given by:

$$y[n] = \sum_{i=0}^{T-1} b_i x[n-i]$$

Where y[n] is the output, x[n] is the input, and $b_i$ is the coefficient, T is the FIR length A typical prior art FIR includes an input, a sequence of (T−1) delay units, T multipliers (that multiply the input sample and (T−1) delayed versions of the input sample) by coefficients to provide T multiplier outputs, and (T−1) adders for adding the T multiplier output to each other to provide a FIR filtered output. A stream of input sampled provides a stream of FIR filtered output samples.

This typical prior art structure represents a pipeline of a single sample, feasible only for up to ~1 GBPs designs. In this structure the sample rate and the clock rate are identical.

In higher speeds, parallel processing architectures are used—as a received stream is serial to parallel converted to multiple input streams that are filtered in parallel to provide multiple FIR filtered output streams—that may be parallel to serial converted to provide a single FIR filtered output stream of the same rate as the received stream.

Some systems, for example systems that have parallel processing architectures may include many FIR filters. Each of the FIR filters may include multiple multipliers. Therefore—some systems may include a large number of multipliers—which contribute to the power consumption of such systems.

There is a growing need to reduce the energy consumption of FIR filters and to reduce the energy consumption of system that include FIR filters.

SUMMARY

There may be provided systems, methods, and computer readable medium as illustrated in the specification.

BRIEF DESCRIPTION OF THE DRAWINGS

The embodiments of the disclosure will be understood and appreciated more fully from the following detailed description, taken in conjunction with the drawings in which:

FIG. 4 is an example of a step of the method of FIG. 3.

DESCRIPTION OF EXAMPLE EMBODIMENTS

Figure 1A:
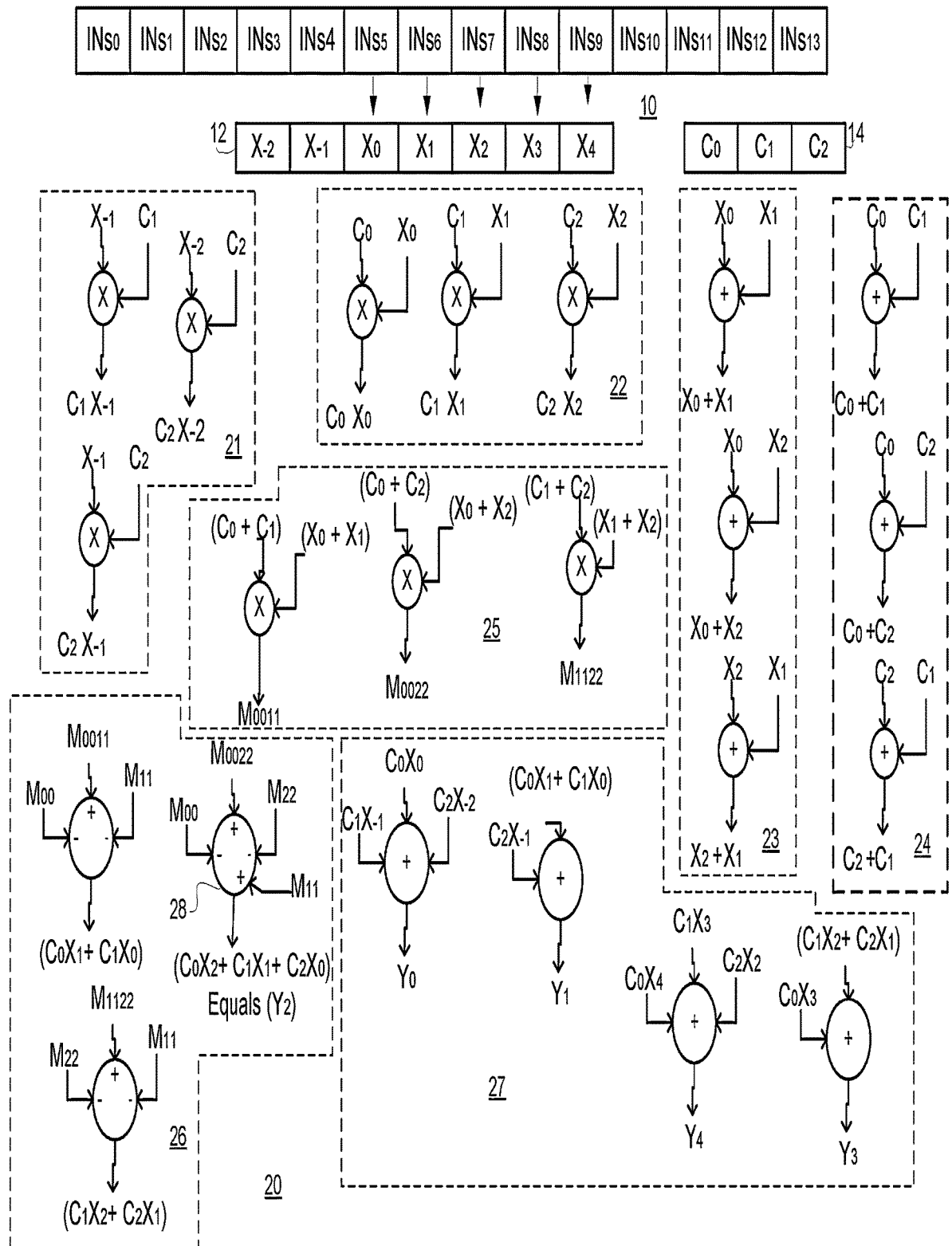
FIG. 1A is an example of a circuit for calculating five FIR filtered output samples.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a device or system capable of executing the method and/or to a non-transitory computer readable medium that stores instructions for executing the method.

Any reference in the specification to a system or device should be applied mutatis mutandis to a method that may be executed by the system, and/or may be applied mutatis mutandis to non-transitory computer readable medium that stores instructions executable by the system.

Any reference in the specification to a non-transitory computer readable medium should be applied mutatis mutandis to a device or system capable of executing instructions stored in the non-transitory computer readable medium and/or may be applied mutatis mutandis to a method for executing the instructions.

Any combination of any module or unit listed in any of the figures, any part of the specification and/or any claims may be provided.

The specification and/or drawings may refer to a processor. The processor may be a processing circuitry. The processing circuitry may be implemented as a central processing unit (CPU), and/or one or more other integrated circuits such as application-specific integrated circuits (ASICs), field programmable gate arrays (FPGAs), full-custom integrated circuits, etc., or a combination of such integrated circuits.

Any combination of any steps of any method illustrated in the specification and/or drawings may be provided.

Any combination of any subject matter of any of claims may be provided.

Any combinations of systems, units, components, processors, sensors, illustrated in the specification and/or drawings may be provided.

The term "and/or" means additionally or alternatively. Thus—A and/or B may be only A, only B or a combination of A and B.

Any reference to consisting should be applied mutatis mutandis to consisting and should be applied mutatis mutandis to consisting essentially of.

Some of the example refer to calculating a set of five or three FIR filtered output results—but the illustrated method, system and computer readable medium are applicable to set of any number of FIR filtered output results.

There may be provided a method, a system, and a computer readable medium for energy efficient FIR filtering.

It has been found that the overall number of multipliers may be reduced by replacing a calculation of some of the coefficient-input sample products by other operations. Yet another reduction of multipliers and/or adders can be obtained by utilizing, when at least some of the coefficient-input sample products calculated during a previous iteration. Each reduction may reduce the energy consumption of the circuit or device or system.

For clarity of explanation the following method will refer to the following example:

$$y_0 = c_0 x_0 + c_1 x_{-1} + c_2 x_{-2}$$

$$y_1 = c_0 x_1 + c_1 x_0 + c_2 x_{-1}$$

$$y_2 = c_0 x_2 + c_1 x_1 + c_2 x_0$$

$$y_3 = c_0 x_3 + c_1 x_2 + c_2 x_1$$

$$y_4 = c_0 x_4 + c_1 x_3 + c_2 x_2$$

Whereas $y_0$ till $y_4$ form a set of five FIR filtered output samples, $c_{-2}$ till $c_2$ are coefficients, $x_{-2}$ till $x_2$ are input samples, and mathematical expressions such as $c_0 x_0$ are coefficient-input sample products. In out example there are fifteen coefficient-input sample products—three per each FIR filtered output sample.

In order to calculate the set of five FIR filtered output samples there is a need to calculate fifteen coefficient-input sample products—and a brute force calculation will require fifteen multipliers.

The suggested method calculates the five FIR filtered output samples in the following manner:

Identifying a set of coefficient-input sample products that can be calculated by a reduced number of multipliers. In our example this set includes a first number (N1) of coefficient-input sample products, wherein in our example N1 equals nine—$c_0 x_0$, $c_0 x_1$, $c_1 x_0$, $c_0 x_2$, $c_1 x_1$, $c_2 x_0$, $c_1 x_2$, $c_2 x_1$, and $c_2 x_2$ $c_0 x_0$ is the only coefficient-input sample product selected from the three coefficient-input sample products used for calculating $y_0$, $c_1 x_1$, $c_2 x_0$ are two out of three coefficient-input sample products used for calculating $y_1$. $c_1 x_1$, $c_2 x_0$, $c_1 x_2$ are all three coefficient-input sample products used for calculating $y_2$. $c_1 x_2$, $c_2 x_1$ are two out of three coefficient-input sample products used for calculating $y_3$. $c_2 x_2$ is the only coefficient-input sample product selected from the three coefficient-input sample products used for calculating $y_4$.

Performing, by first multipliers, an element-wise multiplication of input samples of a first subset of the set by a first subset of coefficients to provide first preliminary results. In our case the number of first multipliers is three—and the first preliminary results include $m_{00}$, $m_{11}$ and $m_{22}$, whereas $m_{00} = c_0 x_0$, $m_{11} = c_1 x_1$, and $m_{22} = c_2 x_2$. The first preliminary results may also be used as first intermediate results.

Calculating second preliminary results. This may include calculating a second number (N2) of sums of coefficient-input sample products that are sums of uncalculated coefficient-input sample products of the first number of coefficient-input sample products. In our example the sums are moon, moon and $m_{1122}$, whereas $m_{0011} = (c_0 + c_1)(x_0 \; x_1)$, $m_{0022} = (c_0 + c_2)(x_0 + x_2)$, and $m_{1122} = (c_1 + c_2)(x_1 + x_2)$.

The calculating of these sums may be executed in two phases
  i. The first phase may include adding the pairs of input samples (for example—$(x_0 + x_1)$, $(x_0 + x_2)$, and $(x_1 + x_2)$) to provide input sample sums, and adding the pairs of coefficients (for example—$(c_0 + c_1)$, $(c_0 + c_2)$, and $(c_1 + c_2)$) to provide coefficient sums. It should be noted that the coefficient sums may be calculated once (if the coefficient maintain the same)—or once after each change of the coefficients—and may be used during the calculation of multiple sets of FIR filtered output samples.
  ii. The second phase may include performing, by second multiplies, an element-wise multiplication (for example—$(c_0 + c_1)(x_0 + x_1)$, $(c_0 + c_2)(x_0 + x_2)$, and $(c_1 + c_2)(x_1 + x_2)$) of the input samples sums by coefficients sums to provide second preliminary results.

Extracting second intermediate results. This may include using adders and/or subtractor units to extract the second intermediate results based on the first intermediate results. In out example—the second intermediate results may include (i) $c_0 x_1 + c_1 x_0 = m_{0011} - m_{00} - m_{11}$, (ii) $c_0 x_2 + c_1 x_1 + c_2 x_0 = m_{0022} - m_{00} - m_{22} - m_{11}$, and (iii) $c_1 x_2 + c_2 x_1 = m_{1122} - m_{11} - m_{22}$.

Obtaining additional coefficient-input sample products. In our example there is a need to calculate $c_0 x_3$, $c_0 x_4$ and $c_2 x_2$. On the other hand $c_1 x_{-1}$, $c_2 x_{-2}$ and $c_2 x_{-1}$ can be calculated or may be obtained from a calculation of a previous set of five FIR filtered output samples. Thus $x_{-1}$ may be $x_4$ of the previous calculation and $x_{-2}$ may be $x_3$ of the previous calculation.

Figure 1B:
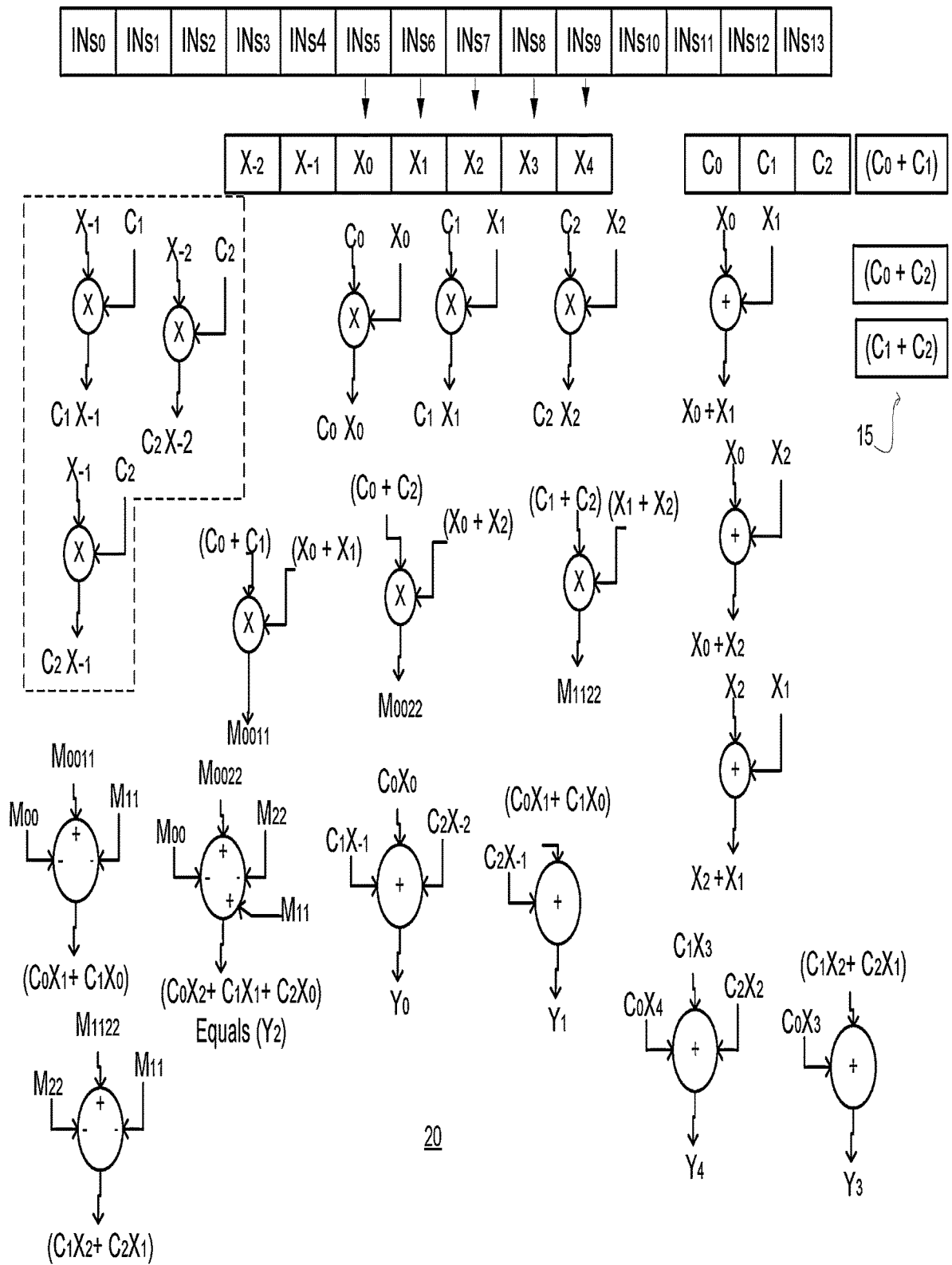
FIG. 1B is an example of a circuit for calculating five FIR filtered output samples.
Figure 1C:
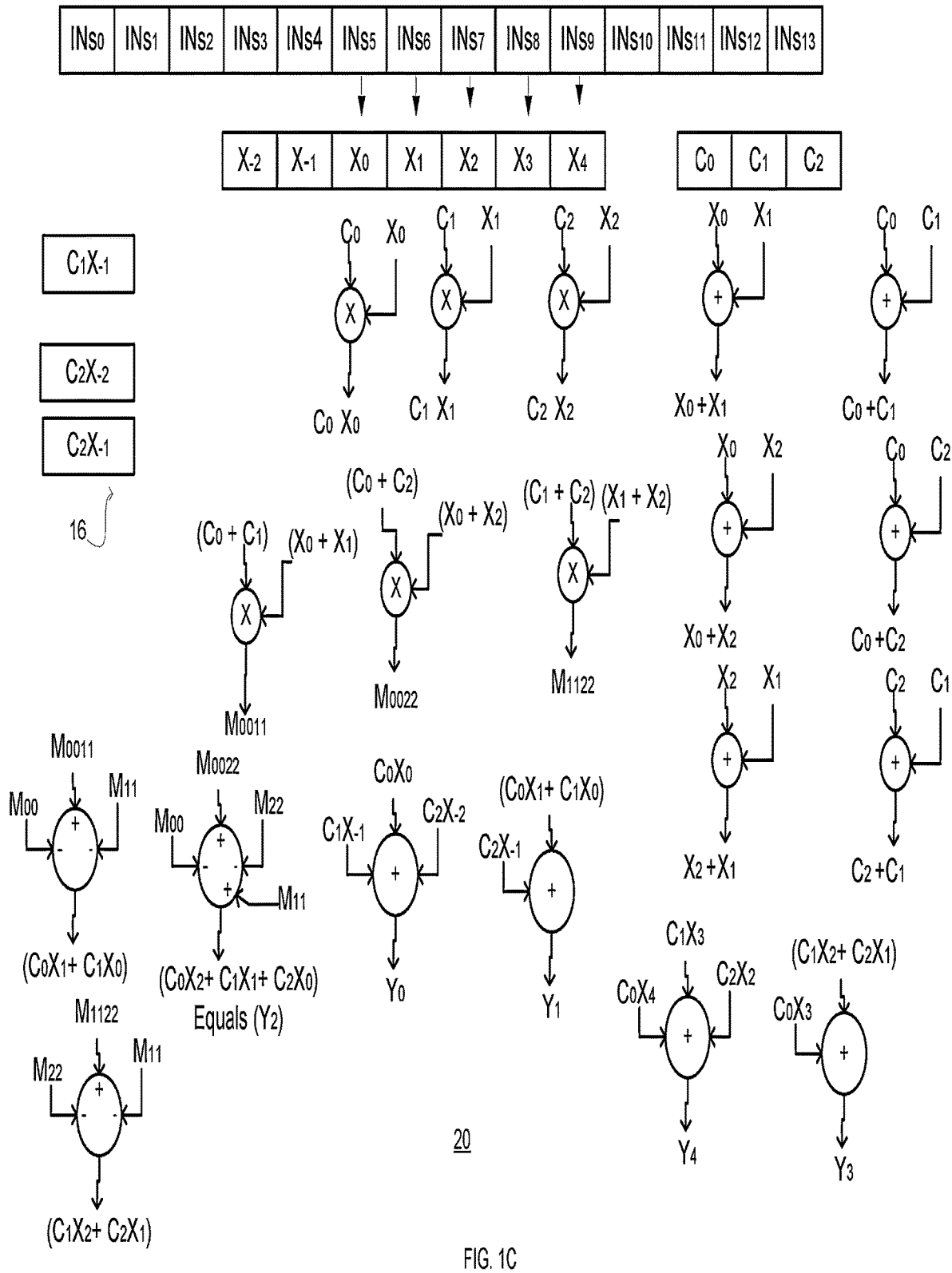
FIG. 1C is an example of a circuit for calculating five FIR filtered output samples.
Figure 1D:
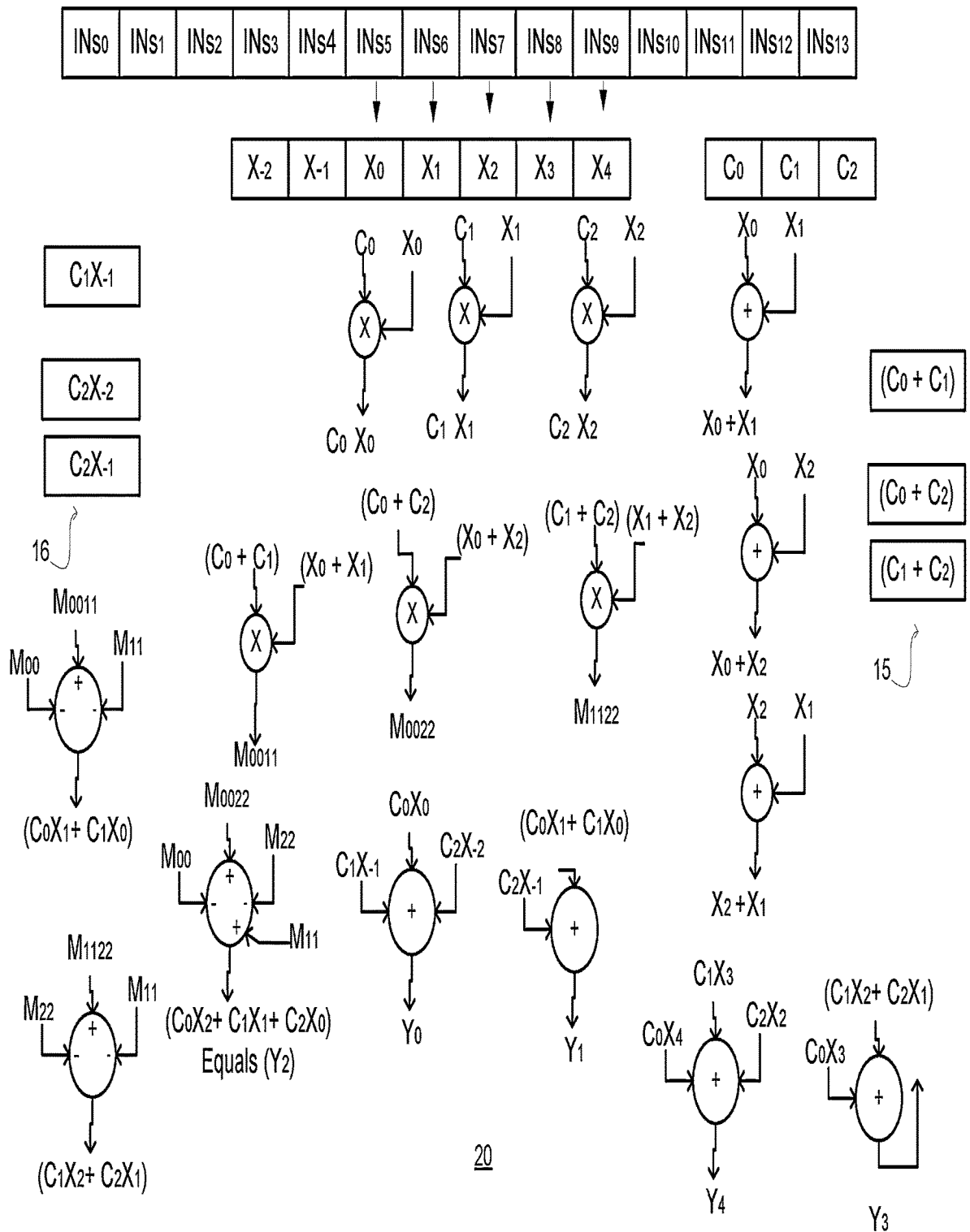
FIG. 1D is an example of a circuit for calculating five FIR filtered output samples.

FIGS. 1A-1D illustrate difference circuits for calculating five FIR filtered output samples. The circuits differ from each other by the manner that coefficient sums and additional CIS products are obtained. In FIG. 1A the coefficient sums and the additional CIS products are calculated. In FIG. 1B the coefficient sums are retrieved from memory and the additional CIS products are calculated. In FIG. 1C the coefficient sums are calculated and the additional CIS products are retrieved from memory. In FIG. 1D the coefficient sums and the additional CIS products are retrieved from memory. FIGS. 1A-1D illustrate different tradeoffs between memory resources and logic units.

Referring to FIG. 1A—an input stream 10 of thirteen input samples (there are much more input samples—only some are illustrated) is provided—received by an input circuit (not shown). Seven input samples $x_{-2}$ till $x_4$ (stored in input 12) are fetched. Three coefficients $c_1$, $c_2$, and $c_3$ are provided (stored in memory 14—which may be a part of input 12).

FIG. 1A also illustrates a FIR filtering circuit 20 that is configured to concurrently apply a FIR filtering process on the set of input samples to provide a set of FIR filtered output samples; wherein the concurrently applying of the FIR filtering process comprises calculating intermediate results that represent a first number of coefficient-input sample products, while calculating only some of the first number of coefficient-input sample products, wherein the calculating of the intermediate results is executed by using less than a first number of multipliers.

The FIR filtering circuit 20 include various multipliers, add-subtract units, and adders denoted 21-28.

Three coefficient sums are calculated by three coefficient adders 23. Three input sample sums are calculated by first adders 23. Three first multipliers 22 calculate three CIS products. Three additional multipliers 21 calculate three additional CIS products. Three second multiplies 25 perform three element-wise multiplications of the input samples sums by coefficients sums to provide three second preliminary results. Three add-subtract units 26 extract second intermediate results. Two add-subtract units include one addition (+) input and two subtraction (−) inputs. A third add-subtract unit (denoted 27) includes two addition (+) inputs and two subtraction (−) inputs. The third add-subtract unit 28 outputs a second intermediate result that equals one of the FIR filtered output samples.

Four output adders 27 calculate the four other FIR filtered output samples based on the outcome of the first and second add-subtract units, the additional CIS multipliers and the CIS multipliers.

Figure 2:
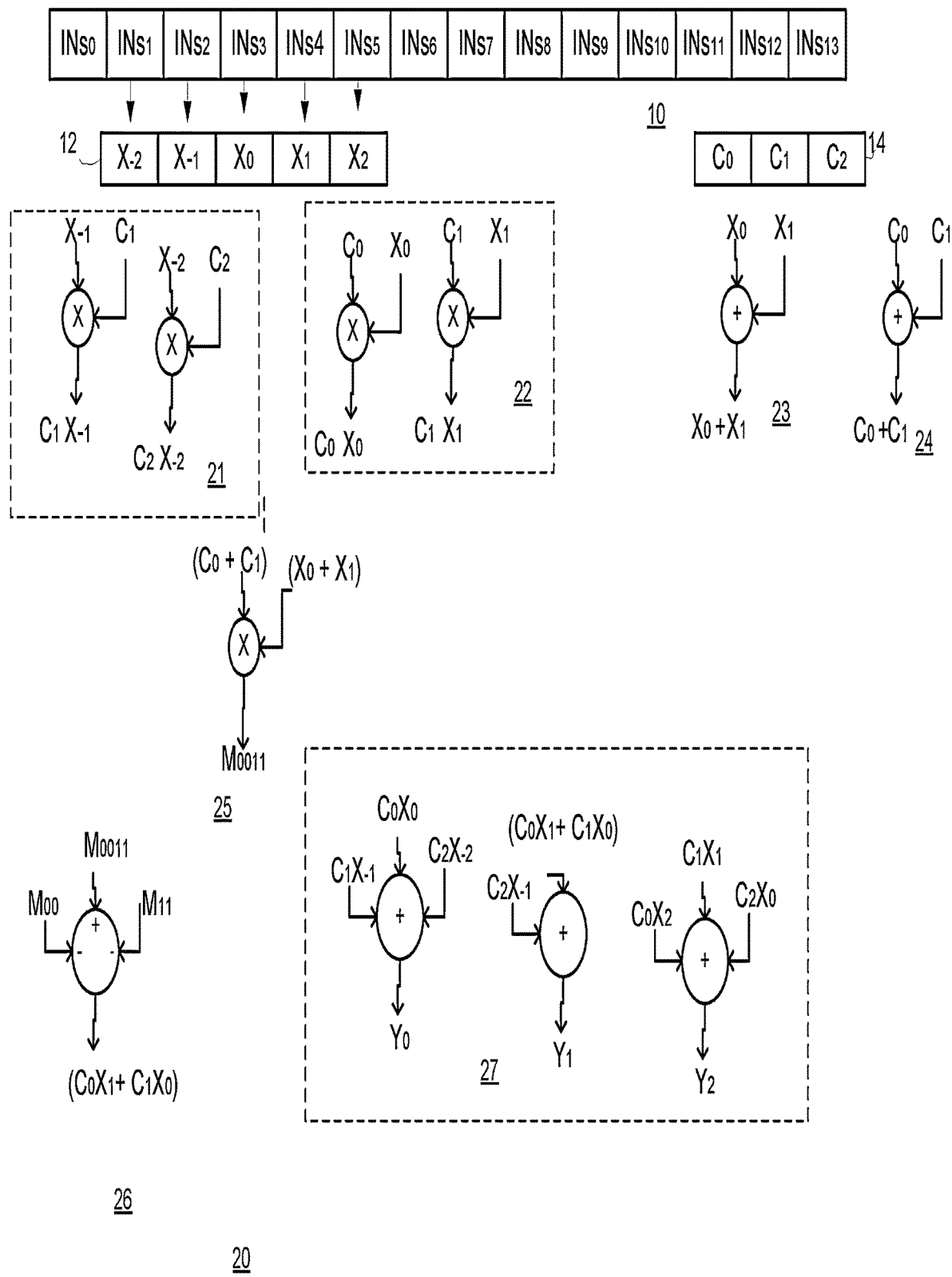
FIG. 2 is an example of a circuit for calculating three FIR filtered output samples.

FIG. 2 illustrates another example with three FIR filtered output samples:

$$y_0 = c_0 x_0 + c_1 x_{-1} + c_2 x_{-2}$$

$$y_1 = c_0 x_1 + c_1 x_0 + c_2 x_{-1}$$

$$y_2 = c_0 x_2 + c_1 x_1 + c_2 x_0$$

In this case there are fewer multipliers and adders. The additional CIS products are $c_1 x_{-1} + c_2 x_{-2}$ and $c_2 x_{-1}$. The only coefficient sum is $c_1 + c_0$. The only input samples sum is $x_1 + x_0$.

Amended circuits that retrieve the coefficient sum and/or additional CIS products may be provided The following calculations are made:

$$m_{0011} = (c_0 + c_1)(x_0 + x_1), m_{00} = c_0 x_0, m_{11} = c_1 x_1.$$

$$c_0 x_1 + c_1 x_0 = m_{0011} - m_{00} - m_{11}.$$

$$y_0 = m_{00} + c_1 x_{-1} + c_2 x_{-2}$$

$$y_1 = m_{0011} - m_{00} - m_{11}$$

$$y_2 = c_0 x_2 + m_{11} + c_2 x_0$$

Figure 3:
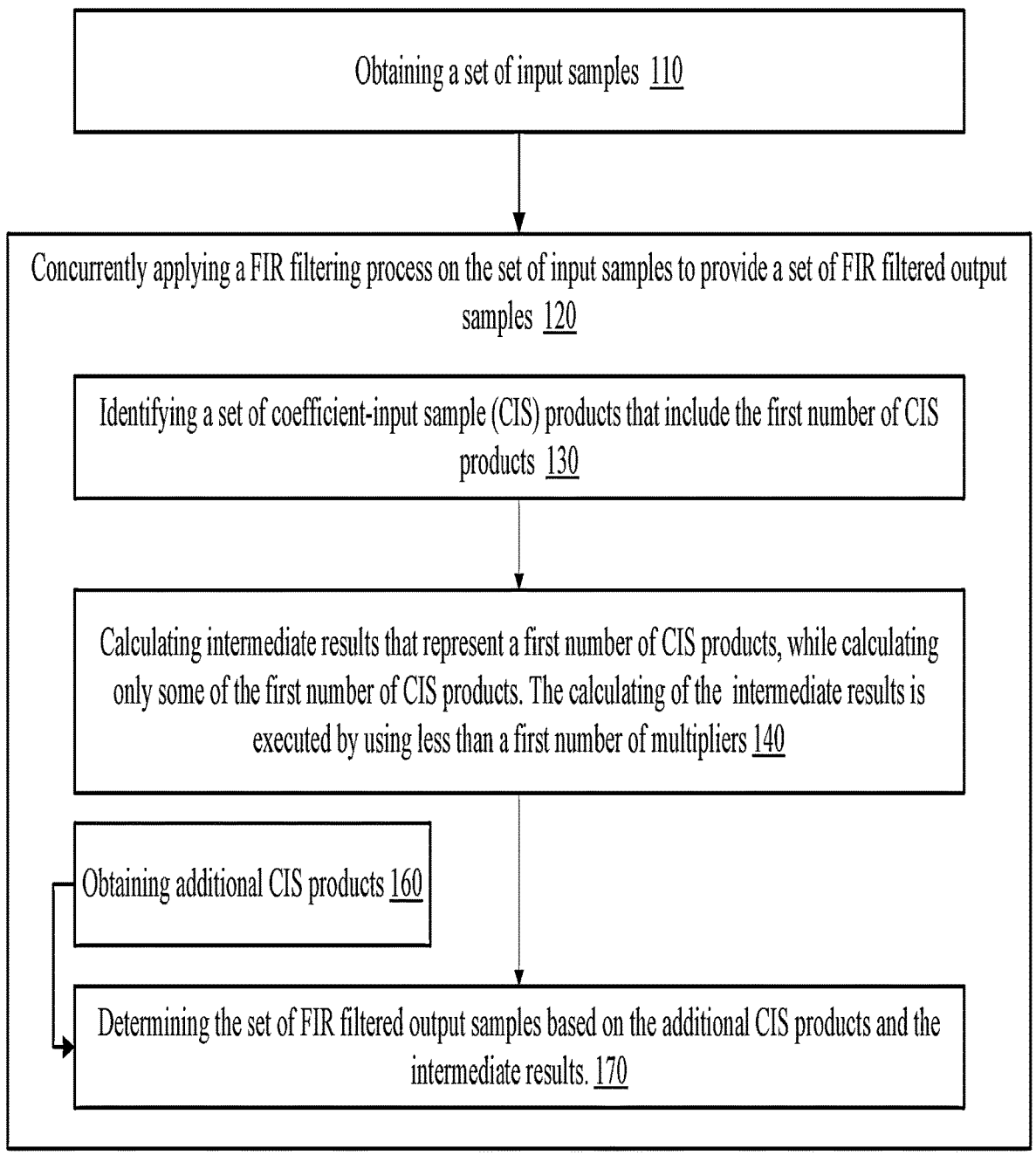
FIG. 3 is an example of a method.

FIG. 3 illustrates method 100 for finite impulse response (FIR) filtering.

Method 100 may start by step 110 of obtaining a set of input samples.

Step 110 may be followed by step 120 of concurrently applying a FIR filtering process on the set of input samples to provide a set of FIR filtered output samples.

Step 120 may include steps 130, 140, 160 and 170.

Step 130 may include identifying a set of coefficient-input sample products that comprises the first number of coefficient-input sample products.

The set may include (a) two repetitions of a single coefficient-input sample (CIS) product from multiple CIS products required to calculate a FIR filtered output samples, and (b) a sum of all CIS products required to calculate a FIR filtered output sample. Depending on the number of the FIR filtered output samples per set of FIR filtered output samples—there may be additional sums of CIS products—wherein the number of CIS product per FIR filtered output sample gradually increased (for example by one).

Any other selection of such a set of CIS products may be provided.

Step 140 may include calculating intermediate results that represent a first number of coefficient-input sample products, while calculating only some of the first number of coefficient-input sample products. The calculating of the intermediate results is executed by using less than a first number of multipliers.

Step 160 may include obtaining additional CIS products.

Step 160 may include calculating all the additional CIS products. This may include calculating a third number of additional CIS products.

Alternatively—step 160 may include calculating a fourth number of additional coefficient-input sample products and retrieving a fifth number of additional coefficient-input sample products from a calculation of a previous set of FIR filtered output samples.

Step 160 may be followed by step 170 of determining the set of FIR filtered output samples based on the additional CIS products and the intermediate results.

Step 170 may be followed by responding to the determining of the set of FIR filtered output samples. This may include outputting the set of FIR filtered output samples, storing the set of FIR filtered output samples, storing at least some of the CIS products to be used in a next iteration.

It should be noted that steps 110-170 may be repeated multiple times—as the FIR filtering is applied on multiple sets of input samples. For example—one or more streams of input samples may be provided and segmented to multiple sets of input samples. An input module may receive a received stream that may be converted to multiple input streams—that may be processed in parallel to each other.

For example—a receiver may receive a received stream that may have a symbol rate that well exceeds (for example by factor of ten, fifty, one hundred, and the like) a clock rate of the received—and it is split to multiple input streams. Each input stream is virtually segmented to sets of input samples—and steps 110-170 illustrates the FIR filtering of a single set of input samples.

FIG. 4 illustrates example of step 140.

Step 140 may include step 142 of performing, by first multipliers, an element-wise multiplication of input samples of a first subset of the set by a first subset of coefficients to provide first intermediate results that belong to the preliminary results.

Step 140 may include step 144 of calculating second preliminary results that are a second number of sums of certain coefficient-input sample products, wherein the second preliminary results are calculated without calculating each one of the certain coefficient-input sample products.

Step 144 may include steps 146, 148, 150 and 152.

Step 146 may include of performing, by first adders, an element-wise addition of pairs of input samples of the set, to provide input samples sums.

Step 148 may include obtaining coefficient sums. The obtaining may include calculating (by coefficient adders) or receiving the coefficient sums.

Steps 146 and 148 may be followed by step 150 of performing, by second multiplies, an element-wise multiplication of the input samples sums by coefficients sums to provide second preliminary results that belong to the preliminary results.

Step 150 may be followed by step 152 of extracting, by using add-subtract units that may include adders and/or subtractors, the second intermediate results.

Any value or number referred to in the application may be a non-limiting example of such a value of number. For example—the number of demodulators per coherent receiver may differ from two, the number of RX units per pluggable modulator may differ from four.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

It is appreciated that various features of the embodiments of the disclosure which are, for clarity, described in the contexts of separate embodiments may also be provided in combination in a single embodiment. Conversely, various features of the embodiments of the disclosure which are, for brevity, described in the context of a single embodiment may also be provided separately or in any suitable sub-combination.

It will be appreciated by persons skilled in the art that the embodiments of the disclosure are not limited by what has been particularly shown and described hereinabove. Rather the scope of the embodiments of the disclosure is defined by the appended claims and equivalents thereof.

What is claimed is:

1. A method for finite impulse response (FIR) filtering, the method comprises:
obtaining a set of input samples; and
concurrently applying a FIR filtering process on the set of input samples to provide a set of FIR filtered output samples;
wherein the concurrently applying of the FIR filtering process comprises calculating intermediate results that represent a first number of coefficient-input sample products, while calculating only some of the first number of coefficient-input sample products, wherein the calculating of the intermediate results is executed by using less than a first number of multipliers.

2. The method according to claim 1 comprising identifying a set of coefficient-input sample products that comprises the first number of coefficient-input sample products.

3. The method according to claim 1 wherein the calculating of the intermediate results comprises calculating second preliminary results that are a second number of sums of certain coefficient-input sample products, wherein the second preliminary results are calculated without calculating each one of the certain coefficient-input sample products.

4. The method according to claim 1 wherein the calculating of the intermediate results comprises performing, by first multipliers, an element-wise multiplication of input samples of a first subset of the set by a first subset of coefficients to provide first intermediate results that belong to the preliminary results.

5. The method according to claim 4 wherein the calculating of the intermediate results comprises performing, by first adders, an element-wise addition of pairs of input samples of the set, to provide input samples sums.

6. The method according to claim 5 wherein the calculating of the intermediate results comprises performing, by second multiplies, an element-wise multiplication of the input samples sums by coefficients sums to provide second preliminary results that belong to the preliminary results.

7. The method according to claim 6 wherein the calculating of the intermediate results comprises calculating the coefficients sums.

8. The method according to claim 6 wherein the calculating of the intermediate results comprises receiving the coefficients sums.

9. The method according to claim 6 wherein the calculating of the intermediate results comprises extracting, by using add-subtract units selected out of adders and subtractors, second intermediate results.

10. The method according to claim 1 further comprises calculating a third number of additional coefficient-input sample products.

11. The method according to claim 1 further comprises calculating a fourth number of additional coefficient-input sample products and retrieving a fifth number of additional coefficient-input sample products from a calculation of a previous set of FIR filtered output samples.

12. A finite impulse response (FIR) filter, comprising: an input that is configured to obtain a set of input samples; and a FIR filtering circuit that is configured to concurrently apply a FIR filtering process on the set of input samples to provide a set of FIR filtered output samples; wherein the concurrently applying of the FIR filtering process comprises calculating intermediate results that represent a first number of coefficient-input sample products, while calculating only some of the first number of coefficient-input sample products, wherein the calculating of the intermediate results is executed by using less than a first number of multipliers.

13. The FIR filter according to claim 12 that is configured to identify a set of coefficient-input sample products that comprises the first number of coefficient-input sample products.

14. The FIR filter according to claim 12, wherein the FIR filtering circuit is configured to calculate the intermediate results by calculating second preliminary results that are a second number of sums of certain coefficient-input sample products, wherein the second preliminary results are calculated without calculating each one of the certain coefficient-input sample products.

15. The FIR filter according to claim 12, wherein the FIR filtering circuit comprises first multipliers that are configured to calculate first intermediate results by performing an element-wise multiplication of input samples of a first subset of the set by a first subset of coefficients to provide first intermediate results that belong to the preliminary results.

16. The FIR filter according to claim 15 wherein the FIR filtering circuit comprises first adders that are configured to calculate the intermediate results comprises performing an element-wise addition of pairs of input samples of the set, to provide input samples sums.

17. The FIR filter according to claim 16 wherein the FIR filtering circuit comprises second multiplies that are configured to perform an element-wise multiplication of the input samples sums by coefficients sums to provide second preliminary results that belong to the preliminary results.

18. The FIR filter according to claim 17 wherein the FIR filtering circuit comprises coefficient adders that are configured to calculate the coefficients sums.

19. The FIR filter according to claim 17 wherein the input is configured to receive the coefficients sums.

20. The FIR filter according to claim 17 wherein the FIR filtering circuit comprises add-subtract units that are configured to extract second intermediate results.

21. The FIR filter according to claim 12 wherein the FIR filtering circuit comprises additional multipliers that are configured to calculate a third number of additional coefficient-input sample products.

22. The FIR filter according to claim 12 wherein the FIR filtering circuit comprises additional multipliers that are configured to calculate a fourth number of additional coefficient-input sample products; and wherein the input is configured to retrieve a fifth number of additional coefficient-input sample products from a calculation of a previous set of FIR filtered output samples.

23. A non-transitory computer readable medium for finite impulse response (FIR) filtering, the non-transitory computer readable medium stores instructions that once executed by a FIR filter, cause the FIR filter to:
    obtain a set of input samples; and
    concurrently apply a FIR filtering process on the set of input samples to provide a set of FIR filtered output samples;
    wherein the concurrently applying of the FIR filtering process comprises calculating intermediate results that represent a first number of coefficient-input sample products, while calculating only some of the first number of coefficient-input sample products, wherein the calculating of the intermediate results is executed by using less than a first number of multipliers.

* * * * *